United States Patent
Chang et al.

(10) Patent No.: US 6,744,610 B2
(45) Date of Patent: Jun. 1, 2004

(54) ELECTROSTATIC DISCHARGE PROTECTION CIRCUIT

(75) Inventors: Yi-Hua Chang, Hsinchu Hsien (TW); Hung-Yi Chang, Hsinchu (TW)

(73) Assignee: Faraday Technology Corp., Hsinchu (TW)

( * ) Notice: Subject to any disclaimer, the term of this patent is extended or adjusted under 35 U.S.C. 154(b) by 408 days.

(21) Appl. No.: 09/990,161

(22) Filed: Nov. 20, 2001

(65) Prior Publication Data

US 2002/0167054 A1 Nov. 14, 2002

(30) Foreign Application Priority Data

May 9, 2001 (TW) .......................................... 90111022 A

(51) Int. Cl.[7] ................................................. H02H 9/00
(52) U.S. Cl. ...................... 361/56; 361/111; 361/91.1; 361/58
(58) Field of Search .................. 361/56, 58, 91.1, 361/111, 127, 115, 15

(56) References Cited

U.S. PATENT DOCUMENTS 5,631,793 A * 5/1997 Ker et al. ..................... 361/56
5,892,262 A * 4/1999 Wu et al. ..................... 257/356
6,388,850 B1 * 5/2002 Ker et al. ..................... 361/56
6,538,868 B2 * 3/2003 Chang et al. ................ 361/111

* cited by examiner

Primary Examiner—Stephen W. Jackson
(74) Attorney, Agent, or Firm—J.C. Patents

(57) ABSTRACT

An electrostatic discharge protection circuit is connected to a bonding pad and a pre-stage driver. The electrostatic discharge protection circuit includes a PMOS transistor and a NMOS transistor and both connect in series. A source/drain region of the PMOS transistor is connected to a system power source, and the gate electrode is connected to a pre-stage drive, and the other source/drain region is connected to a source/drain region of the NMOS transistor, which is also connected to the bonding pad. Another source/drain region of the NMOS transistor is ground. The gate electrode of the NMOS transistor receives an output of the pre-stage driver. Another PMOS transistor is connected to a capacitor and is also connected to the source/drain region of a system power source and the gate electrode of the NMOS transistor.

7 Claims, 2 Drawing Sheets

ELECTROSTATIC DISCHARGE PROTECTION CIRCUIT

CROSS-REFERENCE TO RELATED APPLICATION

This application claims the priority benefit of Taiwan application serial no. 90111022, filed May 9, 2001.

BACKGROUND OF THE INVENTION

1. Field of Invention

The present invention relates to an electronic circuit. More particularly, the present invention relates to an electrostatic discharge (ESD) protection circuit.

2. Description of Related Art

The electrostatic discharge is one of the major causes that damage an integrated circuit (IC), such as an dynamic random access memory (DRAM) or an statistic random access memory (SRAM), during or after the manufacturing process. Therefore, an electrostatic discharge protection circuit is usually made as a part of the circuit to prevent damage on the integrated circuit caused by external electrostatic. The issue of ESD robustness has been reported in the book "ESD IN SILICON INTEGRATED CIRCUIT" by AJITH AMERASEKERA& CHARVAKA DUVVURY, published by John Wiley & Sons.

FIG. 1 illustrates a conventional design of an electrostatic discharge protection circuit. In FIG. 1, the electrostatic discharge protection circuit includes a transistor 50 and an N-type metal-oxide semiconductor (NMOS) 52. A source/drain region of the PMOS transistor 50 is connected to a system power source and another source/drain region is connected to the bonding pad 54. A gate electrode of the PMOS transistor 50 is connected to a pre-stage driver 61. The connected source/drain regions of the NMOS transistor 52 and the PMOS transistor 50 are connected to the bonding pad 54. The gate electrode of the NMOS transistor 52 is connected to a pre-stage driver 60. Another source/drain region of the NMOS transistor 52 is connected to a ground voltage. In this kind of electrostatic discharge protection circuit as shown in FIG. 1, an parasitic capacitor 56 exists between the gate electrode and the source/drain region of the NMOS transistor 52. When an electrostatic pulse enters from the bonding pad 54, it will bring up the voltage of the gate electrode of the NMOS transistor 52 due to the effect of the parasitic capacitor 56. Then, a snap-back voltage of the NMOS transistor 52 is reduced. As a result, the electrostatic charges can flow to the ground through the NMOS transistor 52. If there is no the parasitic capacitor 56 to bring up the voltage of the gate electrode of the NMOS transistor 52, the snap-back voltage of the NMOS transistor 52 will be higher, and therefore the protection capability of the NMOS transistor 52 is reduced. Another conventional design of the electrostatic discharge protection circuit used for over voltage tolerant I/O pad is illustrated in FIG. 2. In FIG. 2, the electrostatic discharge protection circuit includes two NMOS transistors 50, 52. A source/drain region of the NMOS transistor 50 is connected to a bonding pad 54. The gate electrode of the NMOS transistor 50 is connected to a system power source. Another source/drain region of the NMOS transistor 50 is connected to a source/drain region of the NMOS transistor 52. The gate electrode of the NMOS transistor 52 is connected to a pre-stage driver 60. When the electrostatic charges enter from the bonding pad 54, the charges have a longer path to flow to the ground and it has no effective parasitic capacitor to bring up the voltage of the gate electrode of the NMOS transistor in order to reduce the snap-back voltage. In this circuit, the protection capability for the electrostatic charge is far worse than the circuit of FIG. 1.

SUMMARY OF THE INVENTION

The invention provides an electrostatic discharge protection circuit. It includes a capacitor loop for improving the protection on the circuit.

As embodied and broadly described herein, the invention provides an electrostatic discharge protection circuit and is connected between a bonding pad and a pre-stage driver. The electrostatic discharge protection circuit includes a PMOS transistor and a NMOS transistor connected in the series. A source/drain region of the PMOS transistor is connected to a system power source Vcc. And the gate electrode is connected to a pre-stage driver. The other source/drain region of the PMOS transistor is connected to a source/drain region of the NMOS transistor, which is also connected to the bonding pad. The other source/drain region of the NMOS transistor is connected to the ground. The gate electrode of the NMOS transistor receives the output of the pre-stage driver. For the PMOS transistor, a capacitor is connected between a source/drain region connected to system power source Vcc and the gate electrode of the NMOS transistor.

From the above, the loop capacitor, through parasitic diode 58, in parallel with parasitic capacitor 56 to bring up the gate voltage of NMOS transistor 52 where an ESD pulse entering from bonding pad. Thus, a more effective and stable electrostatic discharge protection circuit that can sustain a large electrostatic voltage is provided.

As embodied and broadly described herein, the invention provides the other electrostatic discharge protection circuit and is connected between a bonding pad and a pre-stage device. This electrostatic discharge protection circuit includes a first PMOS transistor, a first NMOS transistor, a second NMOS transistor, a capacitor and a second PMOS transistor. The first PMOS transistor includes a first source/drain region, a second source/drain region and a gate electrode. The first source/drain of the first PMOS transistor is connected to a system power source, and the gate electrode is connected to a pre-stage driver. The second source/drain is connected to the bonding pad. A first NMOS transistor includes a first source/drain region, a second source/drain region and a gate electrode. The first source/drain region of the first NMOS transistor is connected to the bonding pad, and the gate electrode is connected to the system power source. A second NMOS transistor includes a first source/drain region, a second source/drain region and a gate electrode. The first source/drain region of the second NMOS transistor is connected to the second source/drain region of the first NMOS transistor. The second source/drain region of the second NMOS transistor is grounded, and the gate electrode of the second NMOS transistor receives the output of the pre-stage driver. The capacitor includes a first source/drain, a second source/drain region and a gate electrode. The capacitor connects between the first source/drain region of the second PMOS transistor and the substrate of the first PMOS transistor. The gate electrode of the second PMOS transistor is connected to the system power source. The second source/drain region of the second PMOS transistor is connected to the gate electrode of the second NMOS transistor and receives the output of the pre-stage driver.

In above description, the capacitor includes a metal-oxide semiconductor capacitor. The pre-stage device includes a pre-stage driver.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

This invention provides a capacitor loop, for raising the gate voltage of the electrostatic protection circuit during the electrostatic discharging events. Hence, the efficiency and the stabilization of the electrostatic discharge protection circuit are improved. Reference will now be made in detail to the present preferred embodiments of the invention, examples of which are illustrated in the accompanying drawings.

Figure 1:
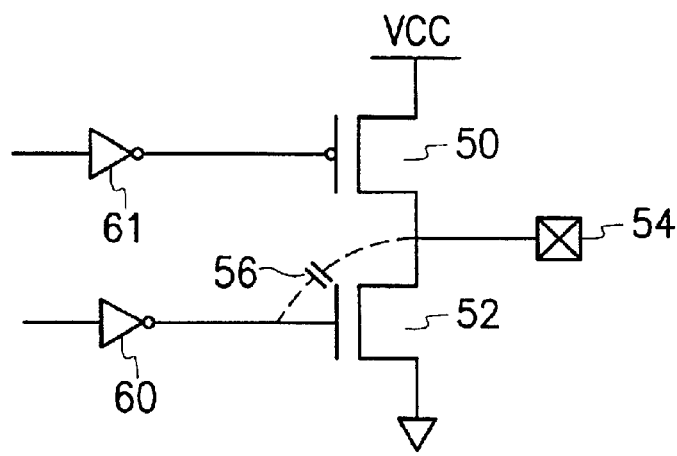
FIG. 1 is a conventional electrostatic discharge protection circuit.
Figure 2:
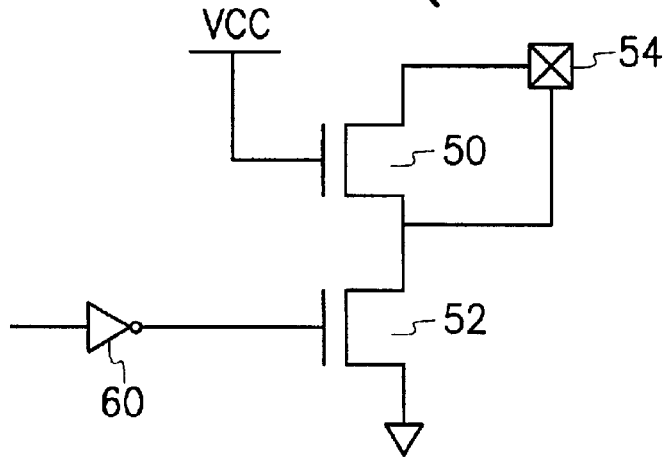
FIG. 2 is another conventional electrostatic discharge protection circuit.
Figure 3:
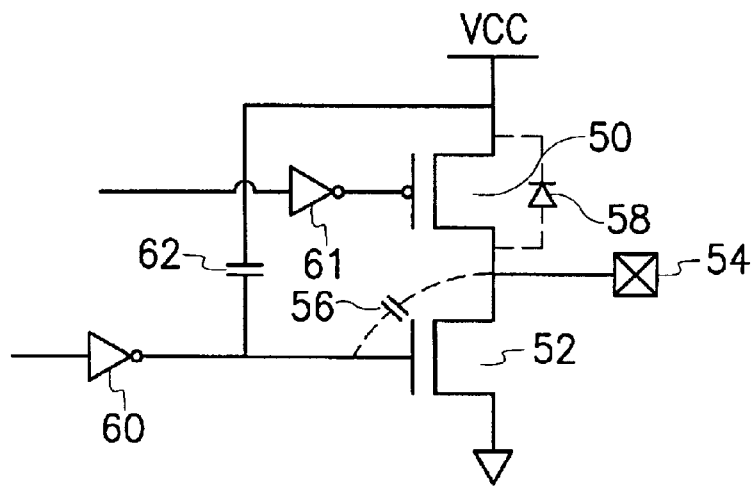
FIG. 3 is an electrostatic discharge protection circuit according to one preferred embodiment of this invention.

FIG. 3 shows an electrostatic discharge protection circuit of the invention. As shown in FIG. 3, the electrostatic discharge protection circuit includes a PMOS transistor 50, a NMOS transistor 52 and a capacitor 62. A source/drain region of PMOS transistor 50 is connected to a system power source Vcc. A gate electrode of PMOS transistor 50 is connected to a pre-stage driver and the other source/drain region is connected to a bonding pad 54 and the NMOS transistor 52. A source/drain region of NMOS transistor 52 and a source/drain region of PMOS transistor 50 are connected to each other, and both of the source/drain regions are also connected to the bonding pad 54. The gate electrode of NMOS transistor 52 receives an output of the pre-stage driving device 60, and is also connected to an electrode of the capacitor 62. The other source/drain region of NMOS transistor 52 is connected to ground. In addition, the other electrode of capacitor 62 is connected to the system power source VCC, so that the capacitor 62 is in parallel with the PMOS transistor 50.

From the above circuit, there exists a parasitic diode 58 in PMOS transistor 50. The parasitic diode is formed by the P+ type source/drain region of PMOS to the N-well which is connected to Vcc to form the bulk of PMOS transistor 50. When the electrostatic pulse enters the bonding pad 54, the gate voltage of the NMOS transistor 52 is brought up due to electrostatic charges flowing through the parasitic diode 58 and the capacitor 62.

Figure 4:
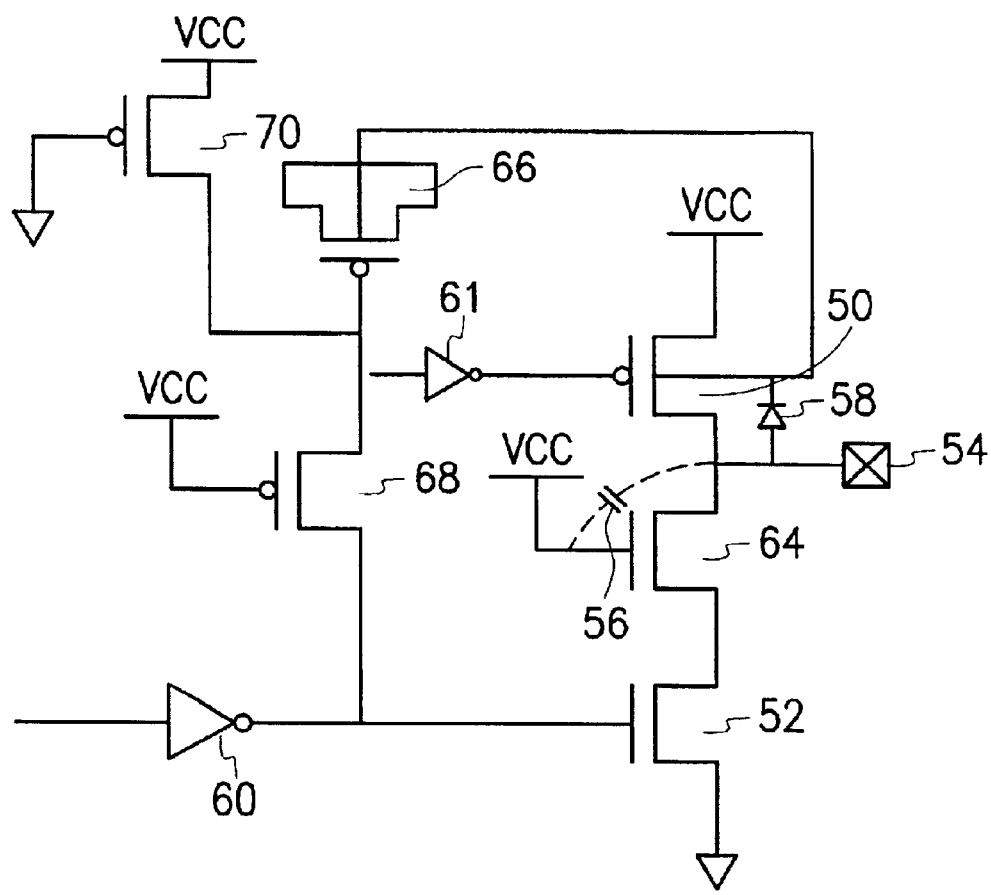
FIG. 4 is the other electrostatic discharge protection circuit according to another preferred embodiment of this invention.

FIG. 4 shows another electrostatic discharge protection circuit, which can be applied to high voltage tolerant I/O circuits, of the invention. In FIG. 3, in order to prevent the gate oxide of the NMOS transistor 52 from being broken down, a thickness of the oxide is used to solve the problem. Alternatively, it can also be solve by adding another NMOS transistor 64. As shown in FIG. 4, the two source/drain regions of the NMOS transistor 64 are connected between the bonding pad 54 and the NMOS transistor 52. The gate electrode of the NMOS transistor 64 is connected to the system power source Vcc.

The capacitor can include a metal-oxide semiconductor (MOS) capacitor 66. An electrode of the MOS capacitor 66 is connected to the substrate of PMOS transistor 50. The structure of the MOS capacitor 66 includes two electrodes, one electrode is connected formed by connecting two source/drain regions and the substrate of the MOS transistor 66, and the other electrode is the gate electrode of the MOS transistor. Referring to FIG. 4, the electrostatic discharge protection circuit also includes a PMOS transistor 68, which has one source/drain region is connected to the MOS capacitor 66. And the other source/drain region of the PMOS transistor 68 is connected to the gate electrode of the NMOS transistor 52 and also receives an output from pre-stage driver 60. The gate electrode of PMOS transistor 68 is connected to the system power source Vcc.

The electrostatic discharge protection circuit at the connecting node of the PMOS transistor 68 and the capacitor 66, further includes another PMOS transistor 70. A source/drain region of the PMOS transistor 70 is connected to the gate electrode of the MOS capacitor 66. Another source/drain region of the PMOS transistor 70 is connected to the system power source Vcc, and the gate electrode is grounded.

For the functional mechanism, since the NMOS transistor 64 always stays at an "ON" state, and the voltage of the NMOS transistor 52 should not be over a breakdown voltage of the device. Therefore, the NMOS transistor 52 can be efficiently protected. In this invention, the capacitor 66 forms a loop, the parasite capacitor of the NMOS transistor 52 is not needed. The PMOS transistor 70 provides a source/drain voltage for the PMOS transistor 68, whereby when a high voltage enters the gate electrode of the PMOS 66 through the bonding pad, the a breakdown between the two source/drain regions of the PMOS transistor 68 due to the too large voltage difference is effectively avoided.

There are some advantages in this invention of an electrostatic discharge protection circuit as follows:

1. Due to the designed path to conduct the electrostatic pulse to a gate electrode of the electrostatic protection NMOS transistor, the gate voltage is raised during the electrostatic discharging events, whereby the electrostatic tolerance is effectively improved.

2. The invention is also suitable for use in an over voltage tolerant circuit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge protection circuit, connecting a bonding pad and a pre-stage device, comprising:

a P-type metal-oxide semiconductor (PMOS) transistor, comprising a first source/drain region, a second source/drain region and a gate electrode, wherein the first source/drain region of the PMOS transistor is connected to a system power source, and the gate electrode is connected to the pre-stage device, and the second source/drain region of the PMOS transistor is connected to the bonding pad;

an N-type metal-oxide semiconductor (NMOS) transistor, comprising a first source/drain region, a second source/drain region and a gate electrode, wherein the first source/drain region of the NMOS transistor is connected to the second source/drain region of the PMOS transistor and the bonding pad, the second source/drain region of the NMOS transistor is grounded, and the gate electrode of the NMOS receives an output from the pre-stage device; and a capacitor, connecting to the source/drain region of the PMOS transistor, which is also connected to the system power source, and the gate electrode of the NMOS transistor.

2. The circuit claimed as claim 1, wherein the pre-stage device comprises a pre-stage driving device.

3. An electrostatic discharge protection circuit, connecting to a bonding pad and a pre-stage device, the electrostatic discharge protection circuit comprising:

a first P-type metal-oxide semiconductor (PMOS) transistor, comprising a first source/drain region, a second source/drain region and a gate electrode, wherein the first source/drain region of the PMOS is connected to a system power source, and the gate electrode is connected to the pre-stage device, and the second source/drain region of the PMOS is connected to the bonding pad;

a first N-type metal-oxide semiconductor (NMOS) transistor, comprising first source/drain region, a second source/drain region and a gate electrode, wherein the first source/drain region of the first NMOS transistor is connected to the bonding pad, and the gate electrode is connected to the system power source;

a second NMOS transistor having a first source/drain region, a second source/drain region and a gate electrode, wherein the first source/drain region of the second NMOS is connected to the second source/drain region of the first NMOS transistor, and the second source/drain region of the second NMOS transistor is connected to the grounded node, and the gate electrode of the second NMOS transistor receives an output of the pre-stage device;

a capacitor; and a second PMOS transistor having a first source/drain region, a second source/drain region and a gate electrode, wherein the capacitor is connected between the first source/drain region of the second PMOS transistor and a substrate of the first PMOS transistor, and the gate electrode of the second PMOS transistor is connected to the system power source, the second source/drain region of the second PMOS transistor is connected to the gate electrode of the second NMOS transistor, and receives the output of the pre-stage device.

4. The circuit claimed as claim 3, wherein the capacitor comprises a metal-oxide semiconductor capacitor.

5. The circuit claimed as claim 4, wherein the metal-oxide semiconductor (MOS) capacitor comprises a MOS transistor having two source/drain regions and a substrate that connect together to serve as a first electrode of the MOS capacitor, and a gate electrode of the MOS transistor serves as a second electrode of the MOS capacitor.

6. The circuit claimed as claim 3, comprising a third PMOS transistor having a first and second source/drain regions and a gate electrode, wherein the first source/drain region of the third PMOS transistor is connected to the system power source, the gate electrode is grounded, and the second source/drain region of the third PMOS transistor is connected between the capacitor and the first source/drain region of the second PMOS transistor.

7. The method claimed as claim 3, wherein the pre-stage device comprises a pre-stage driver.

* * * * *